US012660442B2

(12) United States Patent
Pu et al.

(10) Patent No.: US 12,660,442 B2
(45) Date of Patent: Jun. 16, 2026

(54) DISPLAY SUBSTRATE, PREPARING METHOD THEREOF, AND DISPLAY APPARATUS

(71) Applicants:Yunnan Invensight Optoelectronics Technology Co., Ltd., Kunming (CN); BOE Technology Group Co., Ltd., Beijing (CN)

(72) Inventors: Chao Pu, Beijing (CN); Shengji Yang, Beijing (CN); Pengcheng Lu, Beijing (CN); Kuanta Huang, Beijing (CN); Xiaochuan Chen, Beijing (CN)

(73) Assignees: Yunnan Invensight Optoelectronics Technology Co., Ltd., Kunming (CN); BOE Technology Group Co., Ltd, Beijing (CN)

( * ) Notice: Subject to any disclaimer, the term of this patent is extended or adjusted under 35 U.S.C. 154(b) by 491 days.

(21) Appl. No.: 18/015,965

(22) PCT Filed: Feb. 25, 2022

(86) PCT No.: PCT/CN2022/078076
§ 371 (c)(1),
(2) Date: Jan. 13, 2023

(87) PCT Pub. No.: WO2023/159513
PCT Pub. Date: Aug. 31, 2023

(65) Prior Publication Data
US 2024/0244901 A1 Jul. 18, 2024

(51) Int. Cl.
*H10K 59/131* (2023.01)
*H10K 59/12* (2023.01)

(52) U.S. Cl.
CPC ....... *H10K 59/131* (2023.02); *H10K 59/1201* (2023.02)

(58) Field of Classification Search
CPC ..... H10K 59/131; H10K 59/00; G02F 1/1333
See application file for complete search history.

(56) References Cited

U.S. PATENT DOCUMENTS 11,302,771 B2 * 4/2022 Won ..................... H10D 86/451
2004/0123455 A1 7/2004 Wu et al.
(Continued)

FOREIGN PATENT DOCUMENTS

CN 107452769 A 12/2017
CN 110491904 A 11/2019
(Continued)

*Primary Examiner* — Matthew L Reames
(74) *Attorney, Agent, or Firm* — Ling Wu; Stephen Yang; Ling and Yang Intellectual Property

(57) ABSTRACT

A display substrate includes a display area and a bonding area located on one side of the display area; the display substrate includes a base substrate and a circuit structure layer disposed on the base substrate; the circuit structure layer of the display area is provided with a pixel driving circuit including multiple transistors, the display area further includes a light emitting structure layer and a package structure layer sequentially stacked on a side of the circuit structure layer away from the base substrate, the light emitting structure layer includes a light emitting device connected to the pixel driving circuit; a pad is provided in the circuit structure layer of the bonding area and configured to be bonded and connected to an external circuit board, a surface of the pad is disposed flush with a surface of the circuit structure layer around the pad and away from the base substrate.

8 Claims, 4 Drawing Sheets

(56) References Cited

U.S. PATENT DOCUMENTS

| | | | |
|---|---|---|---|
| 2006/0051951 A1 | 3/2006 | Ghosh et al. | |
| 2014/0103315 A1 | 4/2014 | Jung et al. | |
| 2018/0122877 A1* | 5/2018 | Beak .................. | H10K 59/1216 |
| 2019/0348485 A1 | 11/2019 | Jo et al. | |
| 2020/0091446 A1 | 3/2020 | Seo et al. | |
| 2022/0291538 A1 | 9/2022 | Song et al. | |

FOREIGN PATENT DOCUMENTS

| | | | |
|---|---|---|---|
| CN | 110610975 | * | 12/2019 |
| CN | 110931523 | A | 3/2020 |
| CN | 110931540 | A | 3/2020 |
| CN | 111048571 | A | 4/2020 |
| CN | 111880344 | A | 11/2020 |
| CN | 212135113 | U | 12/2020 |
| JP | 2010-244850 | A | 10/2010 |
| KR | 10-2011-0034789 | A | 4/2011 |
| KR | 10-2014-0048633 | A | 4/2014 |
| WO | WO2019214590 | * | 11/2019 |

* cited by examiner

DISPLAY SUBSTRATE, PREPARING METHOD THEREOF, AND DISPLAY APPARATUS

CROSS-REFERENCE TO RELATED APPLICATION

The present application is a U.S. National Phase Entry of International Application No. PCT/CN2022/078076 having an international filing date of Feb. 25, 2022, the entire content of which is hereby incorporated by reference.

TECHNICAL FIELD

The present disclosure relates to, but is not limited to, the field of display technology, and more particularly, to a display substrate, a preparing method thereof, and a display apparatus.

BACKGROUND

Micro organic light-emitting diode (Micro-OLED) is a micro display developed in recent years, and silicon-based OLED is one of them. A silicon-based OLED can not only achieve active addressing of pixels, but also allow the preparation of a pixel driving circuit, a timing control (TCON) circuit, an over-current protection (OCP) circuit, etc. on a silicon-based substrate, which is conducive to reducing system volume and achieving light weight. A silicon-based OLED is prepared by mature Complementary Metal Oxide Semiconductor (CMOS) integrated circuit process, which has the advantages of small size, high resolution (Pixels Per Inch, PPI), high refresh rate, etc. and is widely used in the near-eye display field of Virtual Reality (VR), Augmented Reality (AR), etc.

SUMMARY

The following is a summary of subject matters described herein in detail. The summary is not intended to limit the protection scope of claims.

An embodiment of the present disclosure provides a display substrate, and the display substrate includes a display area and a bonding area located on one side of the display area; the display substrate includes a base substrate and a circuit structure layer disposed on the base substrate; a pixel driving circuit is disposed in the circuit structure layer of the display area, the pixel driving circuit includes a plurality of transistors, the display area further includes a light emitting structure layer and a package structure layer which are sequentially stacked on a side of the circuit structure layer away from the base substrate, and the light emitting structure layer includes a light emitting device connected to the pixel driving circuit; a pad is provided in the circuit structure layer of the bonding area, the pad is configured to be bonded and connected to an external circuit board, and a surface of the pad is disposed flush with a surface of the circuit structure layer around the pad and away from the base substrate.

An embodiment of the present disclosure further provides a display apparatus including the display substrate described above.

An embodiment of the present disclosure further provides a preparing method of a display substrate and the display substrate includes a display area and a bonding area located on one side of the display area, wherein the preparing method includes:

forming a circuit structure layer on a base substrate; wherein the circuit structure layer of the display area is provided with a pixel driving circuit, and the pixel driving circuit includes a plurality of transistors, a circuit structure layer of the bonding area includes a bonding electrode, and a composite insulating layer disposed on a side of the bonding electrode away from the base substrate, the composite insulating layer is provided with a groove exposing a surface of the bonding electrode away from the base substrate;

forming a filling layer in the groove, wherein a surface of the filling layer is disposed flush with a surface of the composite insulating layer around the groove and away from the base substrate; the bonding electrode and the filling layer constitute a pad, and the pad is configured to be bonded and connected to an external circuit board; and forming a light emitting structure layer on the circuit structure layer of the display area, wherein the light emitting structure layer includes a light emitting device connected to the pixel driving circuit.

An embodiment of the present disclosure further provides a preparing method of a display substrate and the display substrate includes a display area and a bonding area located on one side of the display area, wherein the preparing method includes:

forming a circuit structure layer on a base substrate; wherein the circuit structure layer of the display area is provided with a pixel driving circuit, the pixel driving circuit includes a plurality of transistors, and a pad is provided in a circuit structure layer of the bonding area, the pad is configured to be bonded and connected to an external circuit board, and a surface of the pad is disposed flush with a surface of the circuit structure layer around the pad and away from the base substrate.

Other aspects may be understood upon reading and understanding the drawings and the detailed description.

BRIEF DESCRIPTION OF DRAWINGS

The drawings are intended to provide a further understanding of technical solutions of the present disclosure and form a part of the specification, and are used to explain the technical solutions of the present disclosure together with embodiments of the present disclosure, but are not intended to form limitations on the technical solutions of the present disclosure. Shapes and sizes of various components in the drawings do not reflect actual scales, but are only intended to schematically illustrate the contents of the present disclosure.

DETAILED DESCRIPTION

Those of ordinary skills in the art should understand that modifications or equivalent replacements may be made to the technical solutions of the embodiments of the present disclosure without departing from the spirit and scope of the technical solutions of the embodiments of the present disclosure, and should all fall within the scope of the claims of the present disclosure.

Figure 1:
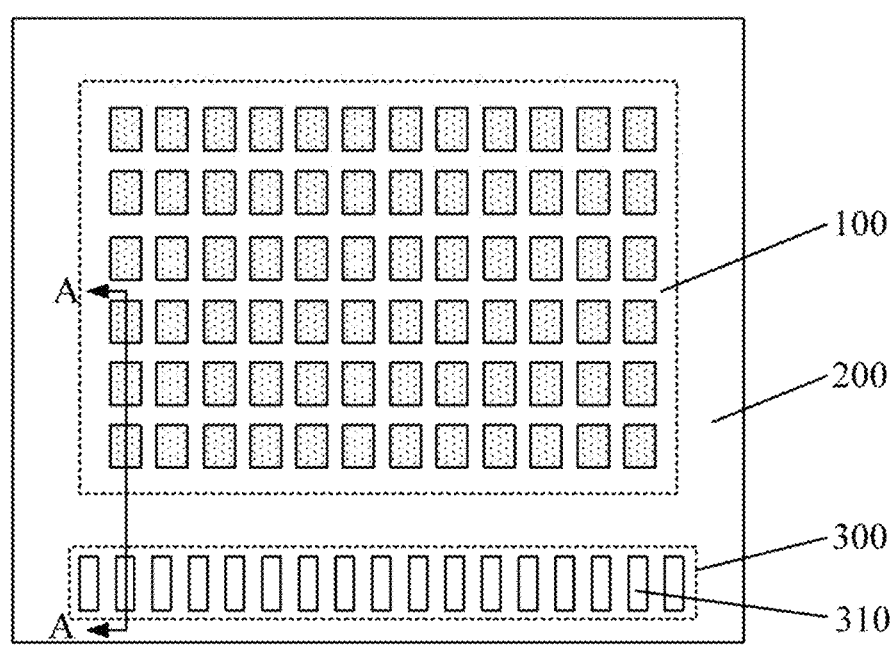
FIG. 1 is a schematic diagram of a planar structure of a display substrate in some exemplary embodiments.

As shown in FIG. 1, FIG. 1 is a schematic diagram of a planar structure of a display substrate in some exemplary embodiments, the display substrate including a display area 100 and a non-display area 200 located around the display area 100, and the non-display area 200 including a bonding area 300 located on one side of the display area 100. The display area 100 is provided with a plurality of sub-pixels arranged regularly to perform image display, each sub-pixel including a pixel driving circuit and a light emitting device connected to the pixel driving circuit, the non-display area 200 is provided with a control circuit for controlling the light emitting of the sub-pixels, and the bonding area 300 is provided with pads 310 bonded and connected to an external circuit board. In the example of FIG. 1, the display area 100 is rectangular and in other implementations the display area 100 may be circular or of other shapes without limitation.

Figure 2:
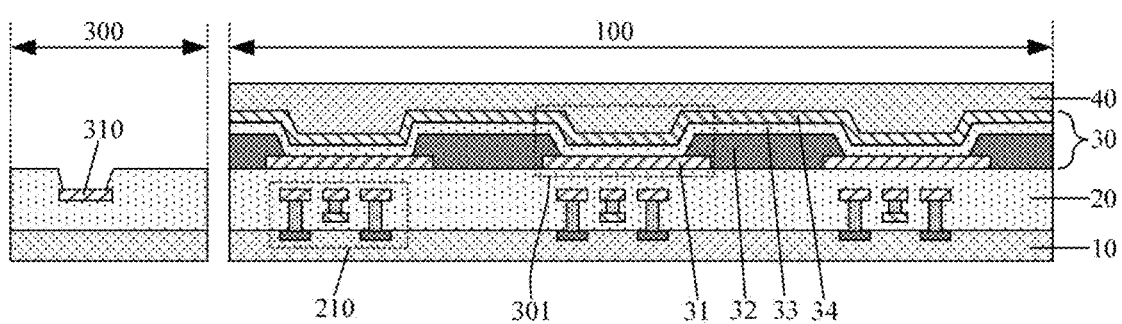
FIG. 2 is a schematic diagram of a cross-sectional structure along A-A of a display substrate in FIG. 1 in some techniques.

As shown in FIG. 2, FIG. 2 is a schematic diagram of a cross-sectional structure along A-A of a display substrate in FIG. 1 in some techniques. Exemplarily, the display substrate may be a silicon-based OLED display substrate, and the display area 100 and the bonding area 300 of the display substrate both include a silicon-based substrate 10 and a circuit structure layer 20 disposed on the silicon-based substrate 10 in a plane perpendicular to the display substrate. A plurality of pixel driving circuits are provided in the circuit structure layer 20 of the display area 100. Each pixel driving circuit includes a plurality of transistors 210 and storage capacitors. The display area 100 further includes a light emitting structure layer 30 and a package structure layer 40 which are sequentially stacked on a side of the circuit structure layer 20 away from the silicon-based substrate 10. The light emitting structure layer 30 includes a plurality of light emitting devices 301, and each light emitting device 301 is connected to a corresponding pixel driving circuit. The light emitting device 301 may include a first electrode 31, a light emitting function layer 33, and a second electrode layer 34 that are sequentially stacked in a direction away from the silicon-based substrate 10. A pad 310 is provided in the circuit structure layer 20 of the bonding area 300. A surface of the pad 310 is disposed below a surface of the circuit structure layer 20 around the pad 310 and away from the silicon-based substrate 10, that is, the position of the pad 310 is in the shape of a pit. In this way, in the process of preparing the first electrode 31 of the display substrate (including film forming, glue coating, light exposure, development, etching and the like processes), during the development process, there will be photoresist residue in the pit where the pad 310 is located, and the photoresist residue will be thrown onto the surface of the film layer prepared on the silicon-based substrate 10 when the silicon-based substrate (which may be called wafer) 10 rotates. The photoresist residue is usually non-conductive. If the photoresist residue is thrown to the overlapping position of metals, it will affect the conductivity performance of the overlapping position, and eventually affect the luminance brightness of some sub-pixels, in turn it will lead to the problem of twill mura (uneven brightness) on the display substrate when displaying pictures, resulting in a decrease in product yield.

Figure 3:
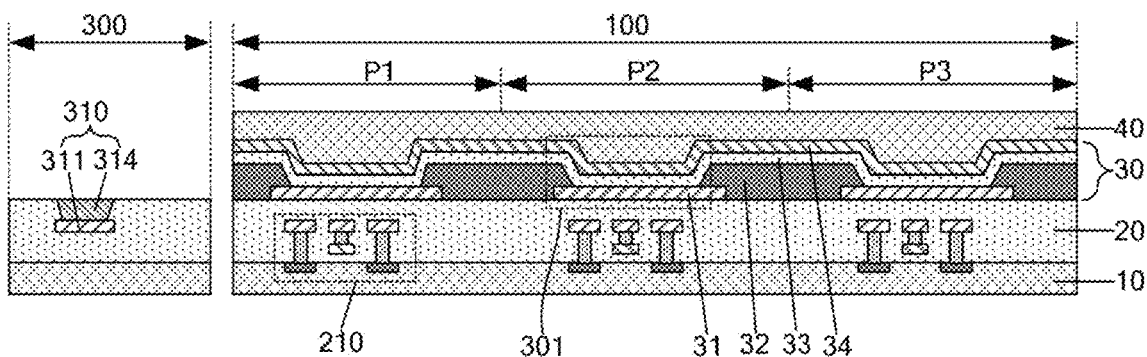
FIG. 3 is a schematic diagram of a cross-sectional structure along A-A of a display substrate in FIG. 1 in some exemplary embodiments.

As shown in FIG. 3, FIG. 3 is a schematic diagram of a cross-sectional structure along A-A of a display substrate in FIG. 1 in some exemplary embodiments. The example in FIG. 3 illustrates three sub-pixels. The display substrate includes a display area 100 and a bonding area 300 located on one side of the display area 100. The display substrate includes a base substrate 10 and a circuit structure layer 20 disposed on the base substrate 10. A pixel driving circuit is provided in the circuit structure layer 20 of the display area 100, and the pixel driving circuit includes a plurality of transistors 210. The display area 100 further includes a light emitting structure layer 30 and a package structure layer 40 which are sequentially stacked on the side of the circuit structure layer 20 away from the base substrate 10, and the light emitting structure layer 30 includes a light emitting device 301 connected to the pixel driving circuit. A pad 310 is provided in the circuit structure layer 20 of the bonding area 300, and the pad 310 is configured to be bonded and connected to an external circuit board. The surface of the pad 310 is disposed flush with the surface of the circuit structure layer 20 around the pad 310 and away from the base substrate 10.

In a display substrate of an embodiment of the present disclosure, the surface of the pad 310 is disposed flush with the surface of the circuit structure layer 20 around the pad 310 and away from the base substrate 10, as such, no pit is not formed at a location where the pad 310 is located. In this way, in the process of preparing the first electrode of the light emitting device 301 of the display substrate, there is no photoresist residue at the position where the pad 310 is located during the development process, so that the problem of twill mura caused by the photoresist residue in the pit of the pad 310 when the display substrate displays a screen can be avoided, resulting in an improvement in product yield.

Herein, the surface of the pad is disposed flush with the surface of the circuit structure layer around the pad and away from the substrate, where "flush" means that the height difference between the surface of the pad and the surface of the circuit structure layer around the pad and away from the substrate is allowed to be within a certain error range. The error range may be from 95% to 110% for the ratio of the surface height of the pad to the surface height of the circuit structure layer around the pad and away from the base substrate, taking the surface of the base substrate as a reference plane.

In some exemplary embodiments, as shown in FIG. 3, the display substrate may be a silicon-based OLED display substrate, and the base substrate 10 of the display substrate is a silicon-based substrate. In other implementations, the display substrate may be another type of display substrate, and the base substrate 10 of the display substrate may be a glass base substrate or a flexible base substrate or the like.

In some exemplary embodiments, as shown in FIG. 3, a pixel driving circuit is provided in the circuit structure layer 20 of the display area 100, and signal lines such as a scan signal line, a data signal line, a power supply line (VDD), etc. are also provided. The pixel driving circuit includes a plurality of transistors (T) 210 and storage capacitors (C), and the pixel driving circuit may be fabricated using a CMOS (Complementary Metal Oxide Semiconductor) integrated circuit process. The pixel driving circuit may be a circuit structure such as 3T1C, 5T1C or 7T1C and the like, which is not limited in this disclosure.

In some exemplary embodiments, as shown in FIG. 3, the light emitting structure layer 30 may include a first electrode layer, a pixel defining layer 32, a light emitting function layer 33 and a second electrode layer 34. The first electrode layer includes a plurality of first electrodes 31 disposed on the circuit structure layer 20. Each first electrode 31 is connected to a pixel driving circuit. The pixel defining layer 32 is disposed on the side of the plurality of first electrodes 31 away from the base substrate 10 and is provided with a plurality of pixel openings. Each pixel opening exposes a surface of a corresponding first electrode 31 away from the base substrate 10. The light emitting function layer 33 and the second electrode layer 34 are sequentially stacked on the side of the plurality of first electrodes 31 and the pixel defining layer 32 away from the base substrate 10, and each first electrodes 31, light emitting function layer 33 and second electrode layer 34 are sequentially stacked to form a light emitting device 301. Exemplarily, the light emitting device 301 may be an OLED device, and each light emitting device 301 may be a series light emitting device, and may be configured to emit white light.

In some exemplary embodiments, the package structure layer may include a plurality of stacked inorganic material layers, such as a first inorganic material layer and a second inorganic material layer stacked sequentially in a direction away from the base substrate. The materials of the first inorganic material layer and the second inorganic material layer may include any one or more of the following: silicon nitride, silicon oxide, and silicon oxynitride. In other implementations, the package structure layer may further include an organic material layer disposed between the first inorganic material layer and the second inorganic material layer.

In some exemplary embodiments, the display substrate may further include a color filter layer disposed on the side of the package structure layer away from the base substrate. The color filter layer includes a plurality of filter units capable of transmitting set color light, for example, a red filter unit capable of transmitting red light, a green filter unit capable of transmitting green light, and a blue filter unit capable of transmitting blue light. The white light emitted by each light emitting device passes through a corresponding filter unit and then emits light of a corresponding color.

In some exemplary embodiments, as shown in FIG. 3, the circuit structure layer 20 of the bonding area 300 includes a bonding electrode 311, and a composite insulating layer disposed on the side of the bonding electrode 311 away from the base substrate 10. The composite insulating layer is provided with a groove that exposes the surface of the bonding electrode 311 away from the base substrate 10, and a filling layer 314 is provided in the groove. The surface of the filling layer 314 is disposed flush with the surface of the composite insulating layer around the groove away from the base substrate 10. The pad 310 includes the bonding electrode 311 and the filler layer 314, and the surface of the pad 310 is the surface of the filler layer 314.

In some exemplary embodiments, as shown in FIG. 3, the circuit structure layer 20 of the display area 100 includes a plurality of conductive layers sequentially disposed in a direction away from the base substrate 10. The bonding electrode 311 is provided in the same layer as one of the plurality of conductive layers, and the filling layer 314 is not provided in the same layer as a film layer of the plurality of conductive layers. In the present embodiment, after forming the circuit structure layer 20 of the display area 100, the bonding electrode 311 of the bonding area 300, and the composite insulating layer located on the side of the bonding electrode 311 away from the base substrate 10, and before the first electrode 31 is prepared, a conductive material may be filled into the groove of the composite insulating layer and the groove is filled up, and the conductive material filled in the groove is the filling layer 314.

"A and B are disposed in the same layer" described herein refers to that A and B are formed simultaneously through the same patterning process.

In some exemplary embodiments, the circuit structure layer of the display area includes a plurality of conductive layers sequentially disposed in a direction away from the base substrate. The pad includes a bonding electrode and at least one connection layer arranged on the side of the bonding electrode away from the base substrate. One of the connection layers close to the bonding electrode is connected to the bonding electrode through conductive posts, and the two adjacent connection layers are connected through conductive posts. The bonding electrode and any one of the connection layers are disposed in the same layer as a film layer in the plurality of conductive layers.

Figure 4:
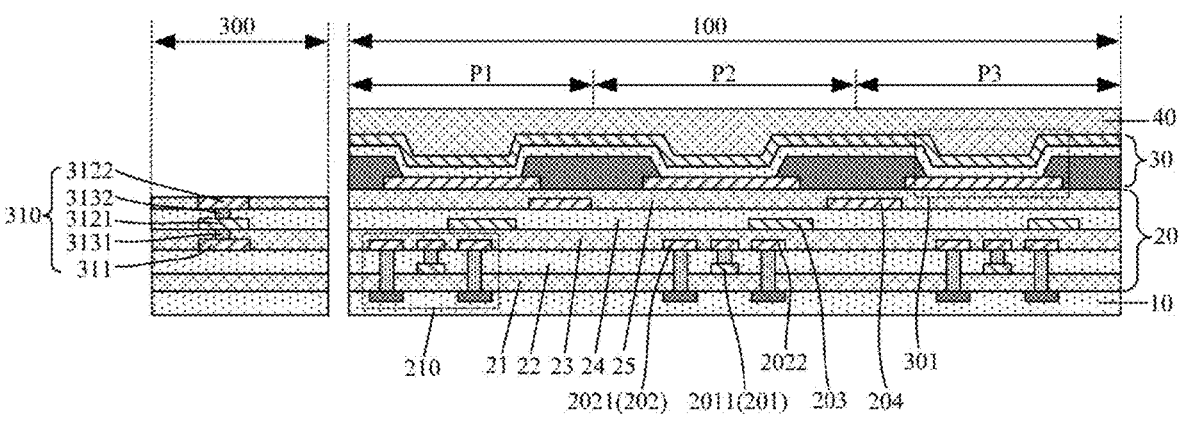
FIG. 4 is a schematic diagram of a cross-sectional structure along A-A of a display substrate in FIG. 1 in some other exemplary embodiments.

In an example of the present embodiment, as shown in FIG. 4, FIG. 4 is a schematic diagram of a cross-sectional structure along A-A of a display substrate in FIG. 1 in some other exemplary embodiments. FIG. 4 illustrates three sub-pixels (P1, P2 and P3, respectively), each of which includes a pixel driving circuit and a light emitting device 301 connected to the pixel driving circuit, and the pixel driving circuit includes a plurality of transistors 210 and storage capacitors. In each sub-pixel of FIG. 4, a transistor 210 is illustrated. Exemplarily, the circuit structure layer 20 of the display area 100 may include a first insulating layer 21, a first conductive layer 201, a second insulating layer 22, a second conductive layer 202, a third insulating layer 23, a third conductive layer 203, a fourth insulating layer 24, a fourth conductive layer 204, and a fifth insulating layer 25 disposed sequentially in the direction away from the base substrate 10. The first conductive layer 201 may include a gate electrode 2011 of the transistor 210 of each sub-pixel and some signal lines (such as a scan signal line). The second conductive layer 202 may include a source electrode 2021 and a drain electrode 2022 of the transistor 210 of each sub-pixel, a data signal line and the like. The third conductive layer 203 may include a power supply line (VDD) and the like, and the fourth conductive layer 204 may include some other signal lines and connection electrodes connected to the other conductive layers, and the like. Exemplarily, the pad 310 may include a bonding electrode 311 and a first connection layer 3121 and a second connection layer 3122 disposed on the side of the bonding electrode 311 away from the base substrate 10, the first connection layer 3121 and the bonding electrode 311 being connected by a first conductive post 3131, and the first connection layer 3121 and the second connection layer 3122 being connected by a second conductive post 3132. The surface of the second connection layer 3122 is the surface of the pad 310 and is disposed flush with the surface of the circuit structure layer 20 around the pad 310 and away from the base substrate 10. The bonding electrode 311 may be disposed in the same layer as the second conductive layer 202, the first connection layer 3121 may be disposed in the same layer as the third conductive layer 203, and the second connection layer 3122 may be disposed in the same layer as the fourth conductive layer 204. Exemplarily, the circuit structure layer 20 of the bonding area 300 may include a first insulating layer 21 and a second insulating layer 22 stacked sequentially disposed on the base substrate 10, a bonding electrode 311 disposed on the second insulating layer 22, a third insulating layer 23 covering the bonding electrode 311, a first connection layer 3121 disposed on the third insulating layer 23, a fourth insulating layer 24 covering the first connection layer 3121, and a second connection layer 3122 and a fifth insulating layer 25 disposed on the fourth insulating layer 24; wherein, a surface of the second connection layer 3122 is disposed flush with a surface of the fifth insulating layer 25 away from the base substrate 10, the third insulating layer 23 is provided with a third via hole, the first connection layer 3121 and the bonding electrode 311 are connected by a first conductive post 3131 provided in the third via hole, the fourth insulating layer 24 is provided with a fourth via hole, and the first connection layer 3121 and the second connection layer 3122 are connected by a second conductive post 3132 provided in the fourth via hole. The materials of the first conductive post 3131 and the second conductive post 3132 may both include tungsten. In this example, the number of insulating layers of the bonding area 300 and the number of insulating layers of the display area 100 are the same, and each is five. The thickness of the fifth insulating layer 25 of the bonding area 300 is less than the thickness of the fifth insulating layer 25 of the display area 100.

In the example of FIG. 4, the circuit structure layer 20 of the display area 100 is provided with four conductive layers, and the connection layer of the pad 310 disposed on the side of the bonding electrode 311 away from the base substrate 10 includes two film layers: a first connection layer 3121 and a second connection layer 3122. In other implementations, the circuit structure layer of the display area may be provided with three, five or more conductive layers, the film layer number of the conductive layers may be set according to the structure of the pixel driving circuit and the wiring mode of signal lines, and the film layer number of the connection layers in the pad may be one, three or more. The present disclosure does not limit the film layer number of the conductive layers of the circuit structure layer of the display area and the film layer number of the connection layers in the pad.

Figure 5:
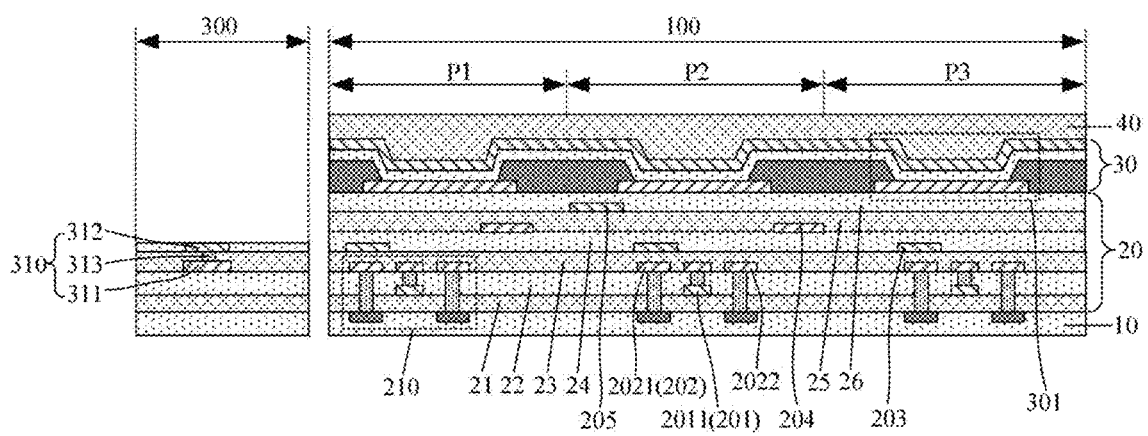
FIG. 5 is a schematic diagram of a cross-sectional structure along A-A of a display substrate in FIG. 1 in some further exemplary embodiments.

In another example of the present embodiment, as shown in FIG. 5, FIG. 5 is a schematic diagram of a cross-sectional structure along A-A of a display substrate in FIG. 1 in some further exemplary embodiments. FIG. 5 illustrates three sub-pixels, each of which includes a pixel driving circuit and a light emitting device 301 connected to the pixel driving circuit, and the pixel driving circuit includes a plurality of transistors 210 and storage capacitors. In each sub-pixel of FIG. 5, a transistor 210 is illustrated. Exemplarily, the circuit structure layer 20 of the display area 100 may include a first insulating layer 21, a first conductive layer 201, a second insulating layer 22, a second conductive layer 202, a third insulating layer 23, a third conductive layer 203, a fourth insulating layer 24, a fourth conductive layer 204, a fifth insulating layer 25, a fifth conductive layer 205, and a sixth insulating layer 26 disposed sequentially in the direction away from the base substrate 10. The first conductive layer 201 may include a gate electrode 2011 of a transistor 210 of each sub-pixel. The second conductive layer 202 may include a source electrode 2021 and a drain electrode 2022 of the transistor 210 of each sub-pixel, and some signal lines (such as a scan signal line). The third conductive layer 203 may include a data signal line, etc. The fourth conductive layer 204 may include a power supply line (VDD), etc. The fifth conductive layer 205 may include a connection electrode, etc. connected to other conductive layers. Exemplarily, the pad 310 may include a bonding electrode 311 and a connection layer 312 disposed on a side of the bonding electrode 311 away from the base substrate 10, and the connection layer 312 and the bonding electrode 311 are connected by a conductive post 313. The surface of the connection layer 312 is the surface of the pad 310 and is disposed flush with the surface of the circuit structure layer 20 around the pad 310 and away from the base substrate 10. The bonding electrode 311 may be disposed in the same layer as the second conductive layer 202, and the connection layer 312 may be disposed in the same layer as the third conductive layer 203. Exemplarily, the circuit structure layer 20 of the bonding area 300 may include a first insulating layer 21 and a second insulating layer 22 stacked sequentially on the base substrate 10, a bonding electrode 311 disposed on the second insulating layer 22, a third insulating layer 23 covering the bonding electrode 311, and a connection layer 312 and a fourth insulating layer 24 disposed on the third insulating layer 23. Wherein, the surface of the connection layer 312 is disposed flush with the surface of the fourth insulating layer 24 away from the base substrate 10, the third insulating layer 23 is provided with a third via hole, and the connection layer 312 and the bonding electrode 311 are connected by a conductive post 313 provided in the third via hole. The material of the conductive post 313 may include tungsten. In this example, the number of insulating layers of the display area 100 is six, the number of insulating layers of the bonding area 300 is four, and the number of the insulating layers of the bonding area 300 is less than the number of the insulating layers of the display area 100. The thickness of the fourth insulating layer 24 of the bonding area 300 is less than the thickness of the fourth insulating layer 24 of the display area 100.

In the example of FIG. 5, the circuit structure layer 20 of the display area 100 is provided with five conductive layers, and the film layer number of the connection layers of the pad 310 on the side of the bonding electrode 311 away from the base substrate 10 is one. In other implementations, the circuit structure layer of the display area may be provided with three, four or more conductive layers, the film layer number of the conductive layers may be set according to the structure of the pixel driving circuit and the wiring mode of signal lines, and the film layer number of the connection layers in the pad may be two, three or more. The present disclosure does not limit the film layer number of the conductive layers of the circuit structure layer of the display area and the film layer number of the connection layers in the pad.

In an example of the present embodiment, as shown in FIG. 4 and FIG. 5, the plurality of conductive layers include a first conductive layer 201 and a second conductive layer 202 that are sequentially disposed in a direction away from the base substrate 10, and at least one conductive layer disposed on the side of the second conductive layer 202 away from the base substrate 10. The first conductive layer 201 may include a gate electrode 2011 of a transistor 210, and the second conductive layer 202 may include a source electrode 2021 and a drain electrode 2022 of the transistor 210. The bonding electrode 311 may be disposed in the same layer as the second conductive layer 202. In other implementations, the bonding electrode 311 may be arranged in the same layer as the other conductive layers according to the structure of the pixel driving circuit in the circuit structure layer 20 of the display area 100 and the wiring mode of signal lines.

In some exemplary embodiments, the number of the insulating layers of the circuit structure layer of the bonding area may be less than or equal to the number of the insulating layers of the circuit structure layer of the display area. Exemplarily, in the example of FIG. 4, the number of the insulating layers of the circuit structure layer 20 of the bonding area 300 is the same as the number of the insulating layers of the circuit structure layer 20 of the display area 100, and each is five. In the example of FIG. 5, the number of insulating layers of the circuit structure layer 20 of the display area 100 is six, the number of insulating layers of the circuit structure layer 20 of the bonding area 300 is four, and the number of insulating layers of the circuit structure layer 20 of the bonding area 300 is less than the number of insulating layers of the circuit structure layer 20 of the display area 100. In other implementations, depending on the structure of the pixel driving circuit and the wiring mode of signal lines, the number of the conductive layers of the circuit structure layer of the display area may be others, and correspondingly, the number of the insulating layers of the circuit structure layer of the display area may be others. The number of insulating layers of the circuit structure layer of the bonding area can be set according to the structure of the pad and the film layer number of the connection layers in the pad. The present disclosure does not limit the number of conductive layers and the number of insulating layers in the circuit structure layer of the display area, and does not limit the number of insulating layers in the circuit structure layer of the bonding area.

An embodiment of the present disclosure further provides a method of preparing a display substrate, the display substrate includes a display region and a bonding region located on one side of the display region; wherein the method includes: forming a circuit structure layer on a base substrate; the circuit structure layer of the display area is provided with a pixel driving circuit, the pixel driving circuit includes a plurality of transistors, and a pad is provided in a circuit structure layer of the bonding area. The pad is configured to be bonded and connected to an external circuit board, and a surface of the pad is disposed flush with a surface of the circuit structure layer around the pad and away from the base substrate.

In some exemplary embodiments, the circuit structure layer of the display area includes a plurality of conductive layers sequentially disposed in a direction away from the base substrate. The pad includes a bonding electrode and at least one connection layer provided on the side of the bonding electrode away from the base substrate, and one connection layer close to the bonding electrode is connected to the bonding electrode through a conductive post, and two adjacent connection layers are connected through a conductive post. The bonding electrode and any one of the connection layers are disposed in the same layer as a film layer of the plurality of conductive layers.

Exemplary description is made below for a preparing process of a display substrate of the present disclosure. A "patterning process" mentioned in the present disclosure includes processes such as photoresist coating, mask exposure, development, etching, and photoresist stripping. Deposition may be any one or more of sputtering, evaporation, and chemical vapor deposition. Coating may be any one or more of spray coating and spin coating. Etching may be any one or more of dry etching and wet etching. A "thin film" refers to a layer of a thin film prepared from a material on a base substrate using a process of deposition or coating. If no patterning process is needed for the "thin film" in the whole making process, the "thin film" may also be called a "layer". If the patterning process is needed for the "thin film" in the whole making process, the thin film is called a "thin film" before the patterning process and called a "layer" after the patterning process. The "layer" after the patterning process includes at least one "pattern". "A and B are arranged in the same layer" in the present disclosure refers to that A and B are simultaneously formed by the same patterning process. In the present disclosure, "an orthographic projection of A includes an orthographic projection of B" means that the orthographic projection of B falls within the range of the orthographic projection of A, or the orthographic projection of A covers the orthographic projection of B.

Taking the structure of the display substrate illustrated in FIG. 4 as an example, the preparing process of the display substrate of an embodiment of the present disclosure is described, and the display substrate illustrated in FIG. 4 is a silicon-based OLED display substrate as an example, and the preparing process may include the following acts.

(1) A silicon-based substrate is formed. In an exemplary implementation, in a silicon-based OLED display substrate, the pixel driving circuit may include a plurality of transistors and storage capacitors, and the plurality of transistors may include at least one P-type transistor and at least one N-type transistor. Forming a silicon-based substrate may include: providing a silicon-based substrate, such as a monocrystalline silicon base substrate; forming a plurality of N-type well regions and a plurality of P-type well regions on a monocrystalline silicon base substrate, wherein the N-type well regions can be used as active layers of the P-type transistors in the pixel driving circuit, and the P-type well regions can be used as active layers of the N-type transistors in the pixel driving circuit.

Figure 6A:
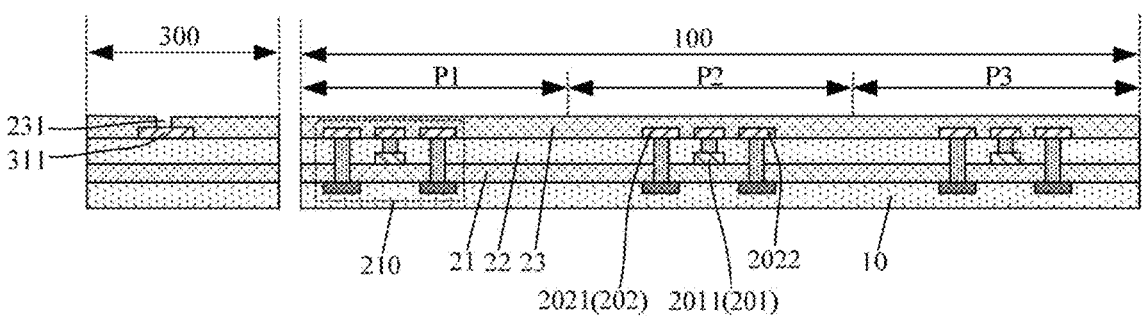
FIG. 6a is a schematic diagram of a structure after a third insulating layer is formed in a preparing method of a display substrate in some exemplary embodiments.

(2) Patterns of a first insulating layer 21 and a first conductive layer 201 are formed. In an exemplary implementation, forming patterns of a first insulating layer 21 and a first conductive layer 201 may include the following acts: sequentially depositing the first insulating film and the polysilicon film on the silicon-based substrate 10, wherein the polysilicon film is patterned by a patterning process to form the first insulating layer 21 covering the silicon-based substrate 10 and the polysilicon layer pattern disposed on the first insulating layer 21; using a polysilicon layer pattern as a shielding layer, performing P-type doping on two regions of the N-type well region to form a first region and a second region of the active layer of the P-type transistor, and performing N-type doping on two regions of the P-type well region to form a first region and a second region of the active layer of the N-type transistor; wherein the polysilicon layer pattern may be heavily doped so that the polysilicon layer with higher resistance becomes a first conductive layer 201 with lower resistance, the first conductive layer 201 may include gate electrodes 2011 of P-type transistors and N-type transistors, and a scan signal line; a region where the gate electrode 2011 overlaps the active layer of the transistor 210 serves as a channel region of the active layer. The above content may be understood with reference to FIG. 6a.

(3) Patterns of a second insulating layer 22 and a second conductive layer 202 are formed. In an exemplary implementation, forming patterns of a second insulating layer 22 and a second conductive layer 202 may include: a second insulating thin film is deposited on the silicon-based substrate 10 on which the aforementioned patterns are formed, the second insulating thin film is patterned by a patterning process to form a second insulating layer 22 covering a pattern of the first conductive layer. The second insulating layer 22 is provided with a plurality of via holes, and the plurality of via holes may include a first via hole and a second via hole. The first insulating layer 21 and the second insulating layer 22 in the first via hole and the second via hole are etched away. The first via hole exposes a first region of the active layer, and the second via hole exposes a second region of the active layer. Then, a second conductive thin film is deposited on the second insulating layer 22. The second conductive film is patterned by a patterning process, and a pattern of the second conductive layer 202 is formed on the second insulating layer 22. The pattern of the second conductive layer 202 includes a source electrode 2021, a drain electrode 2022 and a data signal line located in the display area 100 and a bonding electrode 311 located in the bonding area 300. The source electrode 2021 is connected to a first region of the active layer through a first via hole of the second insulating layer 22, and the drain electrode 2022 is connected to a second region of the active layer through a second via hole of the second insulating layer 22. The above content may be understood with reference to FIG. 6a.

(4) A third insulating layer 23 is formed. In an exemplary implementation, forming a third insulating layer 23 may include: a third insulating thin film is deposited on the silicon-based substrate on which the aforementioned patterns are formed, and the third insulating thin film is patterned by a patterning process to form a third insulating layer 23 covering a pattern of the second conductive layer 202. The third insulating layer 23 is provided with a plurality of via holes located in the display area 100, and a third via hole 231 is located in the bonding area 300. The via hole of the display area 100 may be configured to connect the third conductive layer 203 subsequently formed to the second conductive layer 202. The third via hole of the bonding area 300 exposes a part of the surface of the bonding electrode 311. The above content may be understood with reference to FIG. 6a.

Figure 6B:
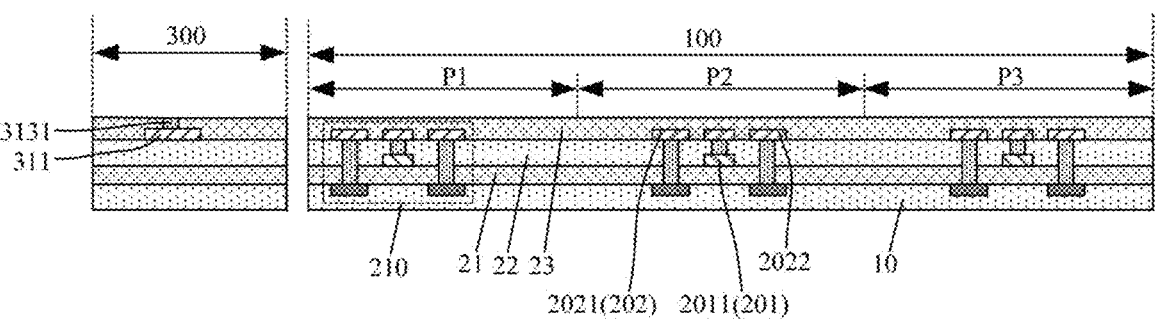
FIG. 6b is a schematic diagram of a structure after a first conductive post is formed in a preparing method of a display substrate in some exemplary embodiments.

(5) A first conductive post 3131 is formed. In an exemplary implementation, a metal conductive material (e.g., a tungsten metal material, and a via hole filled with a tungsten metal may be referred to as a tungsten hole) is filled into a via hole provided in the third insulating layer 23. The metal conductive material filled in the via hole of the third insulating layer 23 may be referred to as a conductive post. The metal conductive material located in the third via hole 231 is a first conductive post 3131. The first conductive post 3131 is configured to connect the first connection layer 3121 formed subsequently to the bonding electrode 311. The conductive posts of the third insulating layer 23 located in the plurality of via holes of the display area 100 may be configured to connect the third conductive layer 203 formed subsequently to the second conductive layer 202. The above content may be understood with reference to FIG. 6b.

Figure 6C:
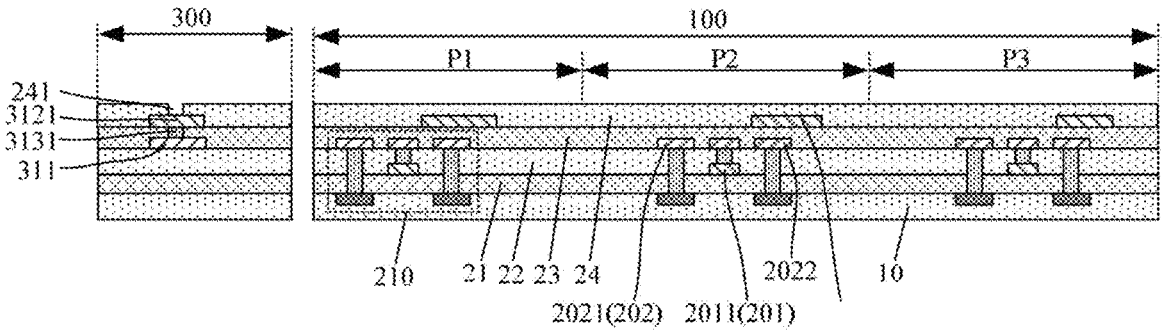
FIG. 6c is a schematic diagram of a structure after a fourth insulating layer is formed in a preparing method of a display substrate in some exemplary embodiments.

(6) A third conductive layer 203 and a fourth insulating layer 24 are formed. In an exemplary implementation, forming a third conductive layer and a fourth insulating layer may include: a third insulating thin film is deposited on the silicon-based substrate on which the aforementioned patterns are formed. The third insulating thin film is patterned by a patterning process to form a pattern of the third conductive layer 203 on the third insulating layer. The pattern of the third conductive layer 203 may include a power line or the like located in the display area 100, and a first connection layer 3121 located in the bonding area 300. The first connection layer 3121 is connected to the bonding electrode 311 by a first conductive post 3131. Subsequently, a fourth insulating thin film is deposited on the silicon-based substrate on which the aforementioned patterns are formed. The fourth insulating thin film is patterned by a patterning process to form a fourth insulating layer 24 covering a pattern of the third conductive layer 203. The fourth insulating layer 24 is provided with a plurality of via holes located in the display area 100 and a fourth via hole 241 located in the bonding area 300. The via hole of the display area may be configured to connect the fourth conductive layer 204 subsequently formed to the third conductive layer 203. The fourth via hole 241 of the bonding area 300 exposes a part of the surface of the first connection layer 3121. The above content may be understood with reference to FIG. 6c.

Figure 6D:
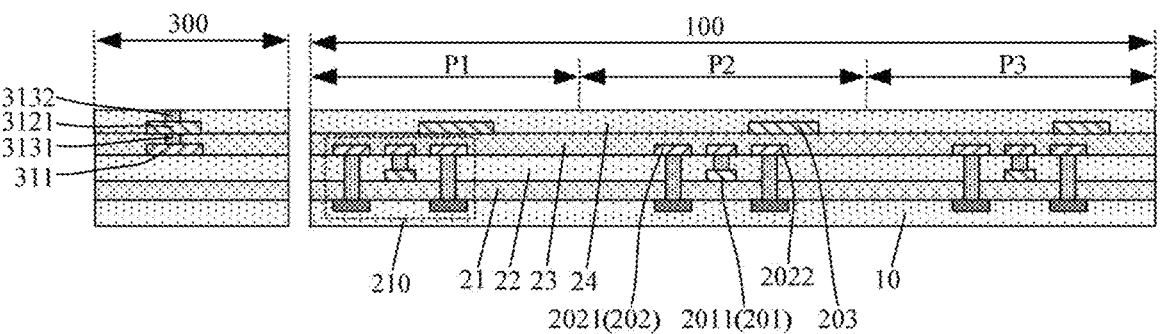
FIG. 6d is a schematic diagram of a structure after a second conductive post is formed in a preparing method of a display substrate in some exemplary embodiments.

(7) A second conductive post 3132 is formed. In an exemplary implementation, a metal conductive material (e.g., a tungsten metal material, and a via hole filled with a tungsten metal may be referred to as a tungsten hole) is filled into a via hole provided in the fourth insulating layer 24. The metal conductive material filled in the via hole of the fourth insulating layer 24 may be referred to as a conductive post. The metal conductive material located in the fourth via hole 241 is a second conductive post 3132. The second conductive post 3132 is configured to connect the second connection layer 3122 subsequently formed to the first connection layer 3121. The conductive posts of the fourth insulating layer 24 located in the plurality of via holes of the display area 100 may be configured to connect the fourth conductive layer 204 subsequently formed to the third conductive layer 203. The above content may be understood with reference to FIG. 6d.

(8) A fourth conductive layer 204 and a fifth insulating layer 25 are formed. In an exemplary implementation, forming a fourth conductive layer 204 may include: depositing a fourth conductive thin film on the silicon-based substrate 10 on which the aforementioned pattern is formed, patterning the fourth conductive thin film by a patterning process, and forming a pattern of the fourth conductive layer 204 on the fourth insulating layer 24. The pattern of the fourth conductive layer 204 may include some signal lines and connection electrodes connected to other conductive layers located in the display area 100, and a second connection layer 3122 located in the bonding area 300. The second connection layer 3122 is connected to the first connection layer 3121 by a second conductive post 3132.

Figure 6E:
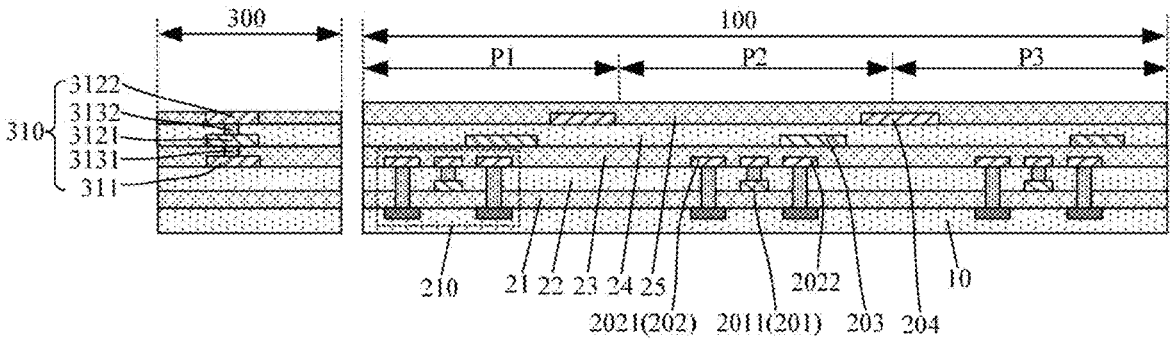
FIG. 6e is a schematic diagram of a structure after a fifth insulating layer is formed in a preparing method of a display substrate in some exemplary embodiments.

Subsequently, the fifth insulating layer 25 is formed on the silicon-based substrate 10 on which the aforementioned pattern is formed. In some examples, forming a fifth insulating layer 25 may include: a fifth insulating thin film is deposited on the silicon-based substrate 10 on which the aforementioned patterns are formed. The fifth insulating thin film is patterned by a patterning process to form a fifth insulating layer 25 covering a pattern of the fourth conductive layer 204. Wherein, patterning the fifth insulating thin film may include: thinning the surface of the fifth insulating thin film of the bonding area 300 away from the base substrate 10, and forming a plurality of via holes on the fifth insulating thin film of the display area 100, thereby forming the fifth insulating layer 25. A surface of the fifth insulating layer 25 of the bonding area 300 away from the base substrate 10 is flush with a surface of the second connection layer 3122. A plurality of via holes provided in the fifth insulating layer 25 of the display area 100 may be configured to connect the first electrode 31 of the light emitting device 301 formed subsequently to the fourth conductive layer 204. In other examples, forming a fifth insulating layer 25 may include: a first sub-insulating thin film is deposited on the silicon-based substrate 10 on which the aforementioned patterns are formed. The surface of the first sub-insulating thin film is disposed flush with the surface of the second connection layer 3122. Subsequently, a second sub-insulating thin film is deposited on the display area 100. The second sub-insulating thin film and the first sub-insulating thin film of the display area 100 are patterned by a patterning process to form a fifth insulating layer 25. Wherein, the fifth insulating layer 25 of the display area 100 includes a first sub-insulating layer and a second sub-insulating layer which are stacked and covers a fourth conductive layer 204 of the display area 100. The fifth insulating layer 25 of the display area 100 is provided with a plurality of via holes, which may be configured to connect the first electrode 31 of the light emitting device 301 formed subsequently to the fourth conductive layer 204. The fifth insulating layer 25 of the bonding area 300 includes a first sub-insulating layer and does not include a second sub-insulating layer. The surface of the fifth insulating layer 25 of the bonding area 300 away from the base substrate 10 is flush with the surface of the second connection layer 3122. The above content may be understood with reference to FIG. 6e.

At this point, the preparing of the circuit structure layer 20 has been completed. The bonding electrode 311, the first conductive post 3131, the first connection layer 3121, the second conductive post 3132, and the second connection layer 3122 constitute the pad 310, and the surface of the second connection layer 3122 is the surface of the pad 310. The surface of the pad is disposed flush with the surface of the circuit structure layer 20 around the pad 310 and away from the base substrate 10.

(9) A light emitting structure layer 30 is formed. In an exemplary implementation, forming a light emitting structure layer 30 may include: a first electrode thin film is deposited on a silicon-based substrate 10 on which the aforementioned patterns are formed. The first electrode thin film is patterned by a patterning process to form a first electrode layer. The first electrode layer includes a plurality of first electrodes 31 located in the display area 100, each of the first electrodes 31 is connected to the fourth conductive layer 204 through a via hole on the fifth insulating layer 25 to achieve a connection with a pixel driving circuit. Thereafter, a pixel defining thin film is formed on the silicon-based substrate 10 on which the aforementioned patterns are formed, the pixel defining thin film is patterned by a patterning process to form a pixel defining layer 32. The pixel defining layer 32 is provided with a plurality of pixel openings, each of which exposes the surface of a corresponding first electrode 31 away from the base substrate 10. Then a light emitting function layer 33 and a second electrode layer 34 are sequentially formed on the silicon-based substrate 10 on which the aforementioned patterns are formed. Each of the first electrode 31, the light emitting function layer 33 and the second electrode layer 34 is sequentially stacked to form a light emitting device 301. The above content may be understood with reference to FIG. 4.

(10) A package structure layer 40 is formed. In an exemplary implementation, forming a package structure layer 40 may include: a first inorganic material thin film and a second inorganic material thin film are sequentially deposited on a silicon-based substrate 10 on which the aforementioned patterns are formed. The first inorganic material thin film and the second inorganic material thin film are patterned by a patterning process to form a package structure layer 40 including the first inorganic material layer and the second inorganic material layer, and the package structure layer 40 covers the display area 100 and exposes the bonding area 300.

An embodiment of the present disclosure further provides a method of preparing a display substrate, which includes a display area and a bonding area located on one side of the display region; wherein the method includes the following acts.

A circuit structure layer is formed on the base substrate. The circuit structure layer of the display area is provided with a pixel driving circuit. The pixel driving circuit includes a plurality of transistors. The circuit structure layer of the bonding area includes a bonding electrode, and a composite insulating layer provided on a side of the bonding electrode away from the base substrate. The composite insulating layer is provided with a groove exposing a surface of the bonding electrode away from the base substrate.

A filling layer is formed in the groove, and a surface of the filling layer is disposed flush with a surface of the composite insulating layer around the groove and away from the base substrate. The bonding electrode and the filling layer constitute a pad, and the pad is configured to be bonded and connected to an external circuit board.

A light emitting structure layer is formed on the circuit structure layer of the display area, and the light emitting structure layer includes a light emitting device connected to the pixel driving circuit.

In some exemplary embodiments, the circuit structure layer of the display area includes a plurality of conductive layers sequentially disposed in a direction away from the base substrate. The bonding electrode is disposed in the same layer as one of the plurality of the conductive layers, and the filling layer is not disposed in the same layer as a film layer of the plurality of the conductive layers.

Taking the structure of the display substrate illustrated in FIG. 3 as an example, the preparing process of another display substrate of an embodiment of the present disclosure is described. The display substrate illustrated in FIG. 3 is a silicon-based OLED display substrate as an example, and the preparing process may include the following acts.

(1) A circuit structure layer 20 is formed on a base substrate 10. In an exemplary embodiment, forming the circuit structure layer 20 on the base substrate 10 may include forming a silicon-based substrate 10 and sequentially forming a plurality of conductive layers on the silicon-based substrate 10.

Figure 7A:
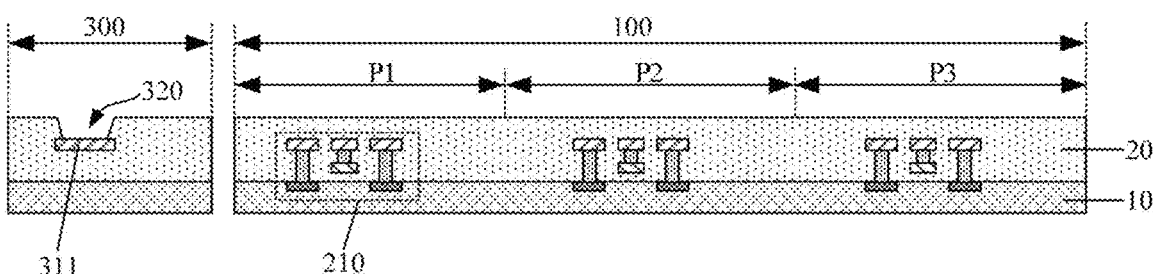
FIG. 7a is a schematic diagram of a structure after a circuit structure layer is formed in a preparing method of a display substrate in some other exemplary embodiments.

After the circuit structure layer 20 is prepared, the circuit structure layer 20 of the display area 100 includes a pixel driving circuit, and signal lines such as a scanning signal line, a data signal line and a power supply line. The pixel driving circuit includes a plurality of transistors 210. The circuit structure layer 20 of the bonding area 300 includes a bonding electrode 311, and a composite insulating layer provided on a side of the bonding electrode 311 away from the base substrate. The composite insulating layer has a groove 320 exposing a surface of the bonding electrode 311 away from the base substrate. Wherein, the bonding electrode 311 is disposed in the same layer as one of the plurality of the conductive layers. The above content may be understood with reference to FIG. 7a.

Figure 7B:
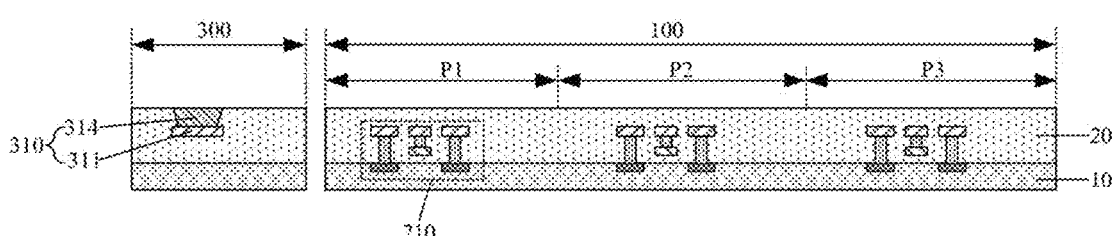
FIG. 7b is a schematic diagram of a structure after a filling layer is formed in a preparing method of a display substrate in some other exemplary embodiments.

(2) A filling layer 314 is formed in the groove 320, and the surface of the filling layer 314 is disposed flush with the surface of the composite insulating layer around the groove 320 and away from the base substrate 10. The filling layer 314 is disposed on the surface of the bonding electrode 311, and the bonding electrode 311 and the filling layer 314 constitute a pad 310. The pad is configured to be bonded and connected to an external circuit board. Wherein, the material of the filling layer 314 may be a metal conductive material, such as aluminum. The above content may be understood with reference to FIG. 7*b*.

(3) A light emitting structure layer 30 and a package structure layer 40 are sequentially formed on the circuit structure layer 20 of the display area 100. The light emitting structure layer 30 includes a light emitting device 301 connected to the pixel driving circuit, and the light emitting device 301 includes a first electrode 31, a light emitting function layer 33 and a second electrode 34, which are sequentially stacked in the direction away from the base substrate 10. The above content may be understood with reference to FIG. 3.

In a preparing method of a display substrate according to an embodiment of the present disclosure, before preparing the first electrode 31 of the light emitting device 301, the surface of the pad 310 is disposed flush with the surface of the circuit structure layer 20 around the pad 310 and away from the base substrate 10, as such, no pit is formed at a location where the pad 310 is located. In this way, in the process of preparing the first electrode 31 of the light emitting device 301, there is no photoresist residue at the position where the pad 310 is located during the development process, so that the problem of twill mura caused by the photoresist residue in the pit of the pad 310 when the display substrate displays a screen can be avoided, resulting in an improvement in product yield.

An embodiment of the present disclosure further provides a display apparatus, which includes the display substrate according to any one of the previous embodiments. The display apparatus may be a near-eye display apparatus, such as VR glasses, a helmet display, etc.; or, the display apparatus can be any product or component with a display function, such as a mobile phone, a tablet computer, a television, a monitor, a notebook computer, a digital photo frame, a navigator, etc.

In the accompanying drawings, a size of a constituent element, and a thickness of a layer or a region are sometimes exaggerated for clarity. Therefore, an implementation of the present disclosure is not necessarily limited to the size, and the shape and size of each component in the drawings do not reflect an actual scale. In addition, the drawings schematically illustrate some examples, and an implementation of the present disclosure is not limited to the shapes or numerical values shown in the drawings.

In the specification, a transistor refers to a component which includes at least three terminals, i.e., a gate electrode, a drain electrode and a source electrode. The transistor has a channel region between the drain electrode (drain electrode terminal, drain region, or drain) and the source electrode (source electrode terminal, source region, or source), and a current may flow through the drain electrode, the channel region, and the source electrode. In the specification, the channel region refers to a region through which a current mainly flows.

In the specification, in order to distinguish two electrodes of a transistor other than a control electrode, one of the two electrodes is directly described as a first electrode, while the other is described as a second electrode. The first electrode may be a drain electrode, and a second electrode may be a source electrode. Or, the first electrode may be a source electrode, and the second electrode may be a drain electrode. In cases that transistors with opposite polarities are used, a current direction changes during operation of a circuit, or the like, functions of the "source electrode" and the "drain electrode" are sometimes interchangeable. Therefore, the "source electrode" and the "drain electrode" are interchangeable in the specification.

In the description herein, "parallel" refers to a state in which an angle formed by two straight lines is above −10° and below 10°, and thus also includes a state in which the angle is above −5° and below 5°. In addition, "vertical" refers to a state in which an angle formed by two straight lines is above 800 and below 100°, and thus also includes a state in which the angle is above 850 and below 95°.

In the specification, for convenience, wordings indicating orientation or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements may be changed as appropriate according to directions for describing the various constituent elements. Therefore, appropriate replacements may be made according to situations without being limited to the wordings described in the specification.

In the description herein, unless otherwise specified and defined explicitly, the terms "connection", "fixed connection", "installation" and "assembly" should be understood in a broad sense, and, for example, may be a fixed connection, a detachable connection or an integrated connection; the terms "installation", "connection" and "fixed connection" may be a direct connection, an indirect connection through intermediate components, or an inner communication between two components. For those ordinarily skilled in the art, meanings of the above terms in the embodiments of the present disclosure may be understood according to situations.

The invention claimed is:

1. A display substrate, comprising a display area and a bonding area located on one side of the display area; wherein the display substrate comprises a base substrate and a circuit structure layer disposed on the base substrate; the circuit structure layer comprises a circuit structure layer in the display area and a circuit structure layer in the bonding area, a pixel driving circuit is disposed in the circuit structure layer of the display area, the pixel driving circuit comprises a plurality of transistors, the display area further comprises a light emitting structure layer and a package structure layer which are sequentially stacked on a side of the circuit structure layer away from the base substrate, and the light emitting structure layer comprises a light emitting device connected to the pixel driving circuit; a pad is provided in the circuit structure layer of the bonding area, the pad is configured to be bonded and connected to an external circuit board, and a surface of the pad is disposed flush with a surface of the circuit structure layer around the pad and away from the base substrate, wherein the circuit structure layer in the display area comprises a plurality of insulating layers and the circuit structure layer in the bonding area comprises a plurality of insulating layers;

wherein the plurality of insulating layers of the circuit structure layer of the bonding area each is arranged in a same layer as a corresponding insulating layer in the plurality of insulating layers of the circuit structure layer of the display area;

wherein a number of the plurality of insulating layers of the circuit structure layer of the bonding area is less than a number of the plurality of insulating layers of the circuit structure layer of the display area;

wherein a bottom surface, facing the base substrate, of an insulating layer, farthest from the base substrate, of the plurality of insulating layers in the circuit structure layer of the bonding area is flush with a bottom surface, facing to the base substrate, of an insulating layer, farthest from the base substrate, of the plurality of insulating layers in the circuit structure layer of the display area;

wherein a top surface, facing away from the base substrate, of the insulating layer, farthest from the base substrate, of the plurality of insulating layers in the circuit structure layer of the bonding area is not flush with a top surface, facing away from the base substrate, of the insulating layer, farthest from the base substrate, of the plurality of insulating layers in the circuit structure layer of the display area; and wherein a thickness of the insulating layer farthest from the base substrate in the circuit structure layer of the bonding area is less a thickness of the insulating layer farthest from the base substrate in the circuit structure layer of the display area.

2. The display substrate according to claim 1, wherein the circuit structure layer of the display area comprises a plurality of conductive layers sequentially disposed in a direction away from the base substrate, and the plurality of insulating layers in the circuit structure layer in the display area and the plurality of conductive layers are disposed in an alternating manner;

the pad comprises a bonding electrode and at least one connection layer disposed on a side of the bonding electrode away from the base substrate, in a case there is one connection layer, the one connection layer close to the bonding electrode is connected to the bonding electrode by a conductive post; in a case there are at least two connection layers, two adjacent connection layers of the at least two connection layers are connected by a conductive post; and one connection layer of the at least two connection layers close to the bonding electrode is connected to the bonding electrode by a conductive post;

the bonding electrode and any one of the at least one connection layer each is disposed in a same layer as one of the plurality of conductive layers.

3. The display substrate according to claim 2, wherein the plurality of conductive layers comprise a first conductive layer and a second conductive layer sequentially disposed in the direction away from the base substrate and at least one conductive layer disposed on a side of the second conductive layer away from the base substrate;

gate electrodes of the transistors are disposed at the first conductive layer, and source electrodes and drain electrodes of the transistors are disposed at the second conductive layer; the bonding electrode is disposed in a same layer as the second conductive layer.

4. The display substrate according to claim 2, wherein a material of the conductive post comprises tungsten.

5. The display substrate according to claim 4, wherein the plurality of conductive layers comprise a first conductive layer and a second conductive layer sequentially disposed in the direction away from the base substrate and at least one conductive layer disposed on a side of the second conductive layer away from the base substrate;

gate electrodes of the transistors are disposed at the first conductive layer, and source electrodes and drain electrodes of the transistors are disposed at the second conductive layer; the bonding electrode is disposed in a same layer as the second conductive layer.

6. The display substrate according to claim 1, wherein the circuit structure layer of the bonding area comprises a bonding electrode, the plurality of insulating layers of the circuit structure layer in the bonding area comprises a composite insulating layer, the composite insulating layer is disposed on a side of the bonding electrode away from the base substrate, the composite insulating layer is provided with a groove exposing a surface of the bonding electrode away from the base substrate, and the groove is provided with a filling layer, a surface of the filling layer is disposed flush with a surface of the composite insulating layer around the groove and away from the base substrate; the pad comprises the bonding electrode and the filling layer, and the surface of the pad is the surface of the filling layer.

7. A display apparatus, comprising a display substrate, wherein:

the display substrate comprises a display area and a bonding area located on one side of the display area; the display substrate comprises a base substrate and a circuit structure layer disposed on the base substrate; the circuit structure layer comprises a circuit structure layer in the display area and a circuit structure layer in the bonding area, a pixel driving circuit is disposed in the circuit structure layer of the display area, the pixel driving circuit comprises a plurality of transistors, the display area further comprises a light emitting structure layer and a package structure layer which are sequentially stacked on a side of the circuit structure layer away from the base substrate, and the light emitting structure layer comprises a light emitting device connected to the pixel driving circuit; a pad is provided in the circuit structure layer of the bonding area, the pad is configured to be bonded and connected to an external circuit board, and a surface of the pad is disposed flush with a surface of the circuit structure layer around the pad and away from the base substrate, wherein the circuit structure layer in the display area comprises a plurality of insulating layers and the circuit structure layer in the bonding area comprises a plurality of insulating layers;

wherein the plurality of insulating layers of the circuit structure layer of the bonding area each is arranged in a same layer as a corresponding insulating layer in the plurality of insulating layers of the circuit structure layer of the display area;

wherein a number of the plurality of insulating layers of the circuit structure layer of the bonding area is less than a number of the plurality of insulating layers of the circuit structure layer of the display area;

wherein a bottom surface, facing the base substrate, of an insulating layer, farthest from the base substrate, of the plurality of insulating layers in the circuit structure layer of the bonding area is flush with a bottom surface, facing to the base substrate, of an insulating layer, farthest from the base substrate, of the plurality of insulating layers in the circuit structure layer of the display area;

wherein a top surface, facing away from the base substrate, of the insulating layer, farthest from the base substrate, of the plurality of insulating layers in the circuit structure layer of the bonding area is not flush with a top surface, facing away from the base substrate, of the insulating layer, farthest from the base substrate, of the plurality of insulating layers in the circuit structure layer of the display area; and wherein a thickness of the insulating layer farthest from the base substrate in the circuit structure layer of the bonding area is less a thickness of the insulating layer farthest from the base substrate in the circuit structure layer of the display area.

8. A preparing method of a display substrate, the display substrate comprising a display area and a bonding area located on one side of the display area, wherein the preparing method comprises:

forming a circuit structure layer on a base substrate, wherein the circuit structure layer comprises a circuit structure layer in the display area and a circuit structure layer in the bonding area, the circuit structure layer of the display area is provided with a pixel driving circuit, and the pixel driving circuit comprises a plurality of transistors, the circuit structure layer of the display area comprises a plurality of insulating layers, the circuit structure layer of the bonding area comprises a plurality of insulating layers and a bonding electrode, the plurality of insulating layers in the circuit structure layer of the bonding area comprises a composite insulating layer disposed on a side of the bonding electrode away from the base substrate, and the composite insulating layer is provided with a groove exposing a surface of the bonding electrode away from the base substrate;

forming a filling layer in the groove, wherein a surface of the filling layer is disposed flush with a surface of the composite insulating layer around the groove and away from the base substrate; the bonding electrode and the filling layer form a pad, and the pad is configured to be bonded and connected to an external circuit board; and forming a light emitting structure layer on the circuit structure layer of the display area, wherein the light emitting structure layer comprises a light emitting device connected to the pixel driving circuit, wherein the plurality of insulating layers of the circuit structure layer of the bonding area each is arranged in a same layer as a corresponding insulating layer in the plurality of insulating layers of the circuit structure layer of the display area;

wherein a number of the plurality of insulating layers of the circuit structure layer of the bonding area is less than a number of the plurality of insulating layers of the circuit structure layer of the display area, wherein a bottom surface, facing the base substrate, of an insulating layer, farthest from the base substrate, of the plurality of insulating layers in the circuit structure layer of the bonding area is flush with a bottom surface, facing to the base substrate, of an insulating layer, farthest from the base substrate, of the plurality of insulating layers in the circuit structure layer of the display area;

wherein a top surface, facing away from the base substrate, of the insulating layer, farthest from the base substrate, of the plurality of insulating layers in the circuit structure layer of the bonding area is not flush with a top surface, facing away from the base substrate, of the insulating layer, farthest from the base substrate, of the plurality of insulating layers in the circuit structure layer of the display area; and wherein a thickness of the insulating layer farthest from the base substrate in the circuit structure layer of the bonding area is less a thickness of the insulating layer farthest from the base substrate in the circuit structure layer of the display area.

* * * * *